United States Patent
Aoki et al.

(10) Patent No.: US 12,219,804 B2
(45) Date of Patent: Feb. 4, 2025

(54) DISPLAY DEVICE

(71) Applicant: Japan Display Inc., Tokyo (JP)

(72) Inventors: Hayata Aoki, Tokyo (JP); Masumi Nishimura, Tokyo (JP)

(73) Assignee: Japan Display Inc., Tokyo (JP)

(*) Notice: Subject to any disclaimer, the term of this patent is extended or adjusted under 35 U.S.C. 154(b) by 386 days.

(21) Appl. No.: 17/574,611

(22) Filed: Jan. 13, 2022

(65) Prior Publication Data

US 2022/0231263 A1    Jul. 21, 2022

(30) Foreign Application Priority Data

Jan. 15, 2021    (JP) ................................ 2021-005019

(51) Int. Cl.
*H10K 50/822*    (2023.01)
*H10K 50/858*    (2023.01)
*H10K 50/852*    (2023.01)
*H10K 59/122*    (2023.01)

(52) U.S. Cl.
CPC ......... *H10K 50/858* (2023.02); *H10K 50/822* (2023.02); *H10K 50/852* (2023.02); *H10K 59/122* (2023.02)

(58) Field of Classification Search
CPC .. H10K 50/858; H10K 59/879; H10K 50/822; H10K 59/80521; H10K 59/122; H10K 50/852; H10K 59/876; H10K 50/8858; H10K 59/351–353; H10K 50/82–828; H01L 33/38; H01L 33/24; H01L 2933/0016; G02B 6/00–007
See application file for complete search history.

(56) References Cited

U.S. PATENT DOCUMENTS

| | | | | |
|---|---|---|---|---|
| 2012/0074398 A1* | 3/2012 | Fujita | ................... | H10K 50/822 |
| | | | | 438/42 |
| 2012/0295016 A1* | 11/2012 | Negishi | ................ | H10K 50/828 |
| | | | | 427/66 |
| 2015/0364523 A1* | 12/2015 | Sato | ..................... | H10K 50/115 |
| | | | | 257/13 |
| 2018/0006267 A1* | 1/2018 | Sakamoto | .......... | H10K 50/8426 |
| 2018/0108869 A1* | 4/2018 | Maeda | ................... | H10K 71/00 |
| 2018/0269429 A1* | 9/2018 | Kudo | ................... | H10K 59/878 |
| 2018/0269430 A1* | 9/2018 | Kojima | ................ | H10K 50/858 |

(Continued)

FOREIGN PATENT DOCUMENTS

JP        2014-056666 A    3/2014
WO    WO 2014/041743 A1    3/2014

*Primary Examiner* — Eric K Ashbahian
*Assistant Examiner* — David W Ward
(74) *Attorney, Agent, or Firm* — Maier & Maier, PLLC

(57) ABSTRACT

According to one embodiment, a display device includes an insulating substrate, a first insulating layer disposed on the insulating substrate, a lower electrode disposed on the first insulating layer, a second insulating layer disposed on the first insulating layer and including an opening overlapping the lower electrode, an organic layer including a light-emitting layer, disposed in the opening and covering the lower electrode, an upper electrode comprising a first end surface, which is an inclined surface, directly above the second insulating layer and stacked on the organic layer and an optical adjustment layer including a second end surface on an inner side with respect to the first end surface and in contact with the upper electrode.

10 Claims, 3 Drawing Sheets

(56) References Cited

U.S. PATENT DOCUMENTS

| | | | |
|---|---|---|---|
| 2019/0103451 A1* | 4/2019 | Kimura | H10K 59/8722 |
| 2019/0348486 A1* | 11/2019 | Gunji | H10K 50/85 |
| 2021/0098745 A1* | 4/2021 | Kirita | H10K 59/876 |
| 2022/0140289 A1* | 5/2022 | Tak | H10K 59/122 |
| | | | 257/40 |

* cited by examiner

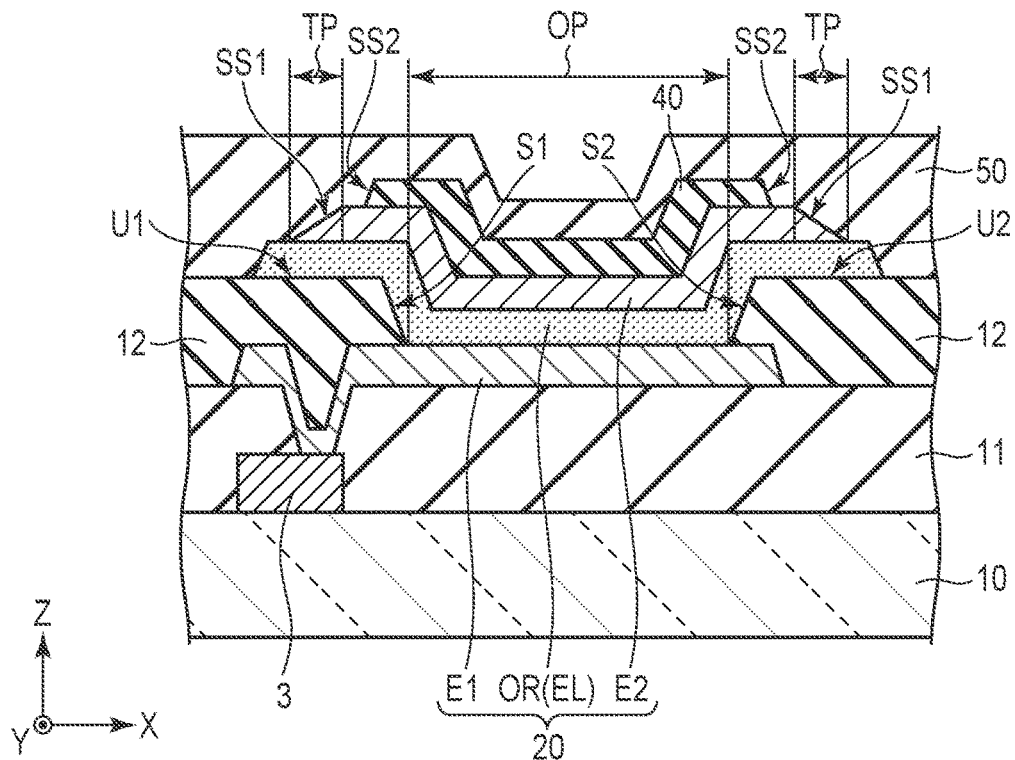
F I G. 4
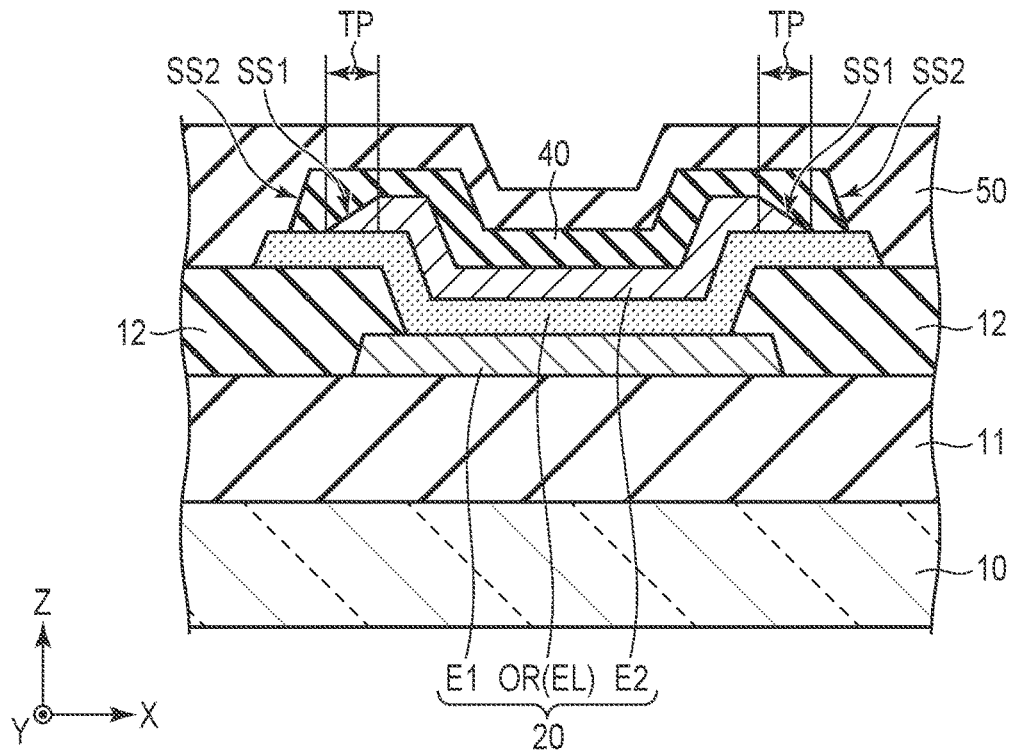
F I G. 5

DISPLAY DEVICE

CROSS-REFERENCE TO RELATED APPLICATIONS

This application is based upon and claims the benefit of priority from Japanese Patent Application No. 2021-005019, filed Jan. 15, 2021, the entire contents of which are incorporated herein by reference.

FIELD

Embodiments described herein relate generally to a display device.

BACKGROUND

In recent years, display devices in which organic light-emitting diodes (OLEDs) are applied as display elements have been used in practical applications. The display element comprises an organic layer between a pixel electrode and a common electrode.

In the field of the top-emission display devices, the application of a microcavity structure thereto is known, which uses the resonance effect of light between a reflective electrode as a pixel electrode and a semi-transmissive electrode as a common electrode. The microcavity structure is a structure configured such that, in display elements emitting red, green and blue colors, respectively, the length of the optical path between the pixel electrode and the common electrode matches the peak wavelength of the spectrum of the emitted light. With this structure, only the light of the wavelength that matches the length of the optical path resonates, thereby improving the luminance and color purity. In such a microcavity structure, it is important to weaken the light of wavelengths deviating from the length of the optical path in order to obtain the desired chromaticity.

BRIEF DESCRIPTION OF THE DRAWINGS

FIG. 4 is a cross-sectional view of the display element 20, take along line A-B in FIG. 3.

FIG. 5 is a cross-sectional view of a comparative example of the display element 20.

DETAILED DESCRIPTION

Figure 1:
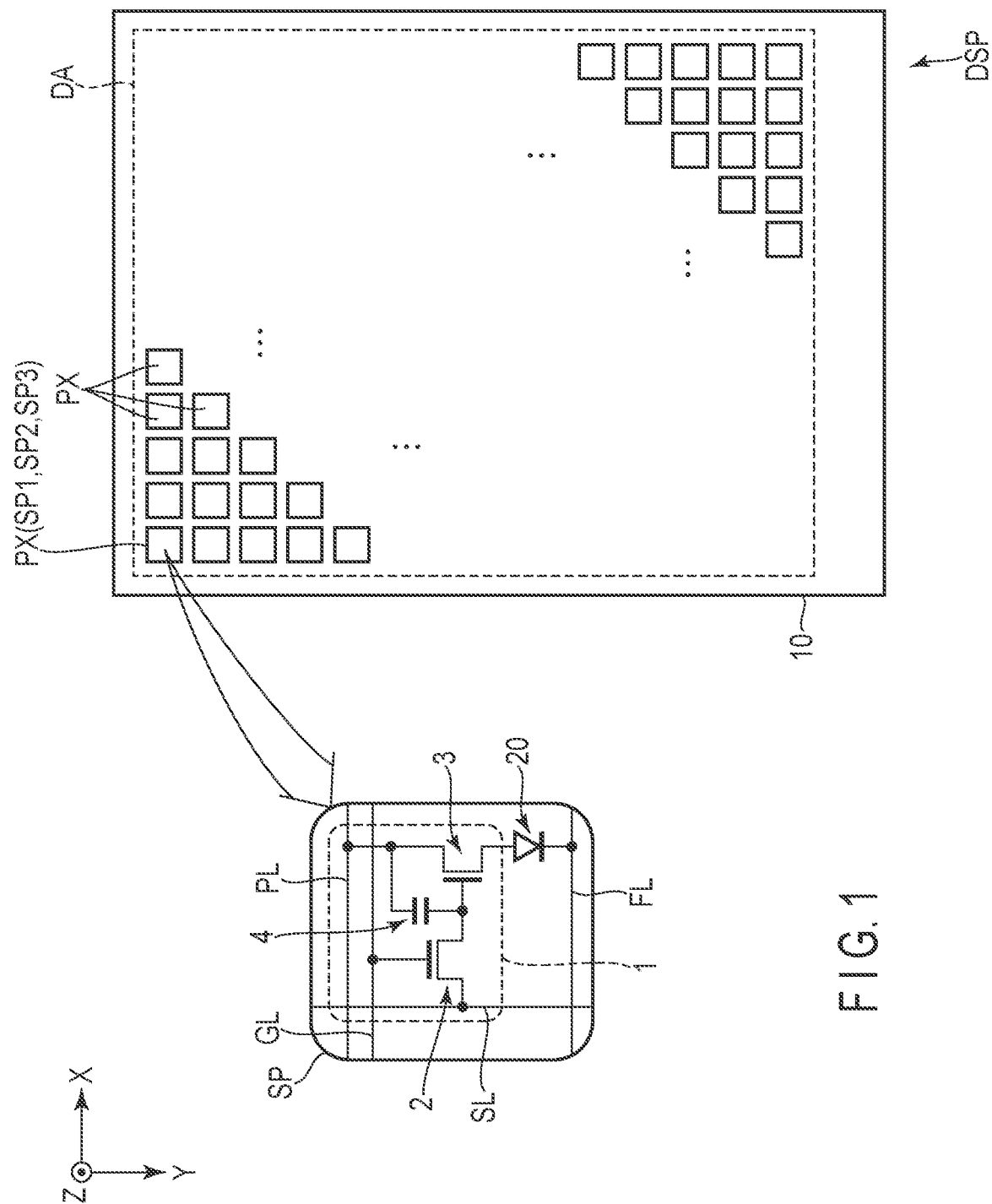
FIG. 1 is a diagram showing a configuration example of a display device DSP according to one embodiment.

In general, according to one embodiment, a display device comprises an insulating substrate, a first insulating layer disposed above the insulating substrate, a lower electrode disposed on the first insulating layer, a second insulating layer disposed on the first insulating layer and comprising an opening overlapping the lower electrode, an organic layer including a light-emitting layer, disposed in the opening and covering the lower electrode, an upper electrode comprising a first end surface, which is an inclined surface, directly above the second insulating layer and stacked on the organic layer and an optical adjustment layer comprising a second end surface on an inner side with respect to the first end surface and in contact with the upper electrode.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane. Further, viewing towards the X-Y plane is referred to as planar view. A direction on the observer side along the third direction is referred to as an upper side, and a surface on the observer side along the third direction is referred to as an upper surface. A direction opposite to the observer along the third direction is referred to as a lower side or a bottom side, and a surface opposite to the observer along the third direction is referred to as a lower surface or a bottom surface.

The display device DSP of this embodiment is an organic electroluminescent display device comprising an organic light-emitting diode (OLED) as a display element, and can be mounted on televisions, personal computers, mobile terminals, cell phones and the like. Note that display element described below can be applied as a light-emitting element of an illumination device, and the display device DSP can be converted to some other electronic device such an illumination device.

FIG. 1 is a diagram showing an example configuration of a display device DSP of this embodiment. The display device DSP comprises a display area DA which displays images, on an insulating base 10. The base 10 is an insulating substrate and may be glass or a flexible resin film.

The display area DA comprises a plurality of pixels PX arranged in a matrix along the first direction X and the second direction Y in the display area DA. The pixels PX each comprises a plurality of subpixels SP1, SP2 and SP3. For example, each pixel PX comprises a red subpixel SP1, a green subpixel SP2 and a blue subpixel SP3. In place of the three subpixels of the three colors, the pixel PX may contain four or more subpixels of other colors, including white.

A configuration example of one subpixel SP contained in a pixel PX will be briefly described.

That is, the subpixel SP comprises a pixel circuit 1 and a display element 20 that is driven and controlled by the pixel circuit 1. The pixel circuit 1 comprises a pixel switch 2, a drive transistor 3 and a capacitor 4. The pixel switch 2 and the drive transistor 3 are switch elements constituted by thin-film transistors, for example.

In the pixel switch 2, a gate electrode thereof is connected to a scanning line GL, a source electrode is connected to a signal line SL and a drain electrode is connected to one of the electrodes constituting the capacitor 4 and the gate electrode of the drive transistor 3. In the drive transistor 3, a source electrode thereof is connected to the other electrode of the capacitor 4 and a power line PL, and a drain electrode is connected to an anode of the display element 20. A cathode of the display element 20 is connected to a power feed line FL. Note that the configuration of the pixel circuit 1 is not limited to that of the example shown in the figure.

The display element 20 is an organic light-emitting diode (OLED), which is a light-emitting element. For example, a subpixel SP1 comprises a display element that emits light corresponding to the red wavelength, a subpixel SP2 comprises a display element that emits light corresponding to the green wavelength, and a subpixel SP3 comprises a display element that emits light corresponding to the blue wavelength. The pixel PX comprises multiple subpixels SP1, SP2 and SP3 of display colors different from each other, and with this configuration, multi-color display can be realized.

Note that the display element 20 may be configured so that the subpixels SP1, SP2 and SP3 emit light of the same color. Thus, monochromatic display can be realized.

Here, when the display elements 20 of the subpixels SP1, SP2 and SP3 are configured to emit white light, a color filter may be disposed to oppose the display elements 20. For example, the subpixel SP1 comprises a red color filter opposing the respective display element 20, the subpixel SP2 comprises a green color filter opposing the respective display element 20, and the subpixel SP3 comprises a blue color filter opposing the respective display element 20. With this structure, it is possible to realize multi-color display.

Alternatively, when the display elements 20 of the subpixels SP1, SP2 and SP3 are configured to emit ultraviolet light, a photo conversion layer is provided to oppose the display elements 20, and thus the multi-color display can be realized.

Figure 2:
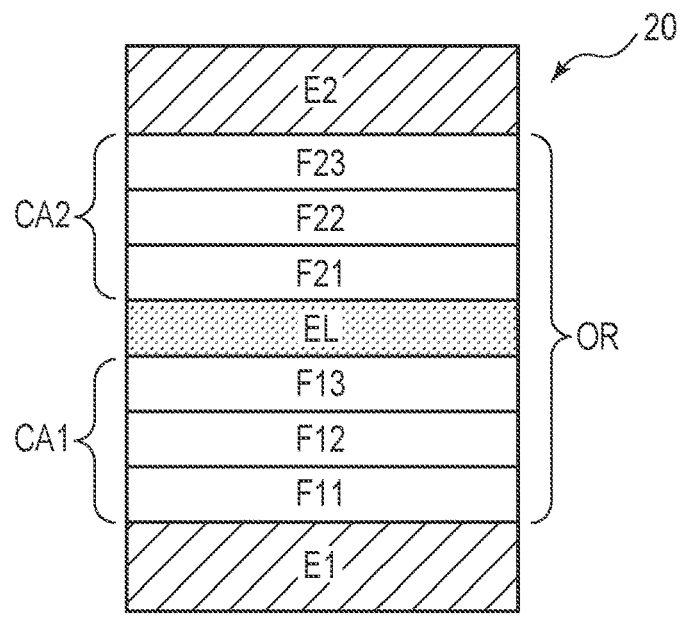
FIG. 2 is a diagram showing an example of a configuration of a display element 20.

FIG. 2 is a diagram showing an example of the configuration of each display element 20.

The display element 20 comprises a lower electrode (first electrode) E1, an organic layer OR and an upper electrode (second electrode) E2. The organic layer OR includes a carrier adjustment layer CA1, a light-emitting layer EL, and a carrier adjustment layer CA2. The carrier adjustment layer CA1 is located between a lower electrode E1 and the light-emitting layer EL, and the carrier adjustment layer CA2 is located between the light-emitting layer EL and an upper electrode E2. The carrier adjustment layers CA1 and CA2 each contain a plurality of functional layers.

Here, the case where the lower electrode E1 corresponds to an anode and the upper electrode E2 corresponds to a cathode will be described as an example.

The carrier adjustment layer CA1 includes a hole injection layer F11, a hole transport layer F12, an electron blocking layer F13 and the like, as functional layers. The hole injection layer F11 is disposed on the lower electrode E1, the hole transport layer F12 is disposed on the hole injection layer F11, the electron blocking layer F13 is disposed on the hole transport layer F12 and the light-emitting layer EL is disposed on the electron blocking layer F13.

The carrier adjustment layer CA2 includes a hole blocking layer F21, an electron transport layer F22, an electron injection layer F23 and the like, as functional layers. The hole blocking layer F21 is disposed on the light-emitting layer EL, the electron transport layer F22 is disposed on the hole blocking layer F21, the electron injection layer F23 is disposed on the electron transport layer F22, and the upper electrode E2 is disposed on the electron injection layer F23.

Note that in addition to the functional layers described above, the carrier adjustment layers CA1 and CA2 may include other functional layers including a carrier generation layer as needed, or at least one of the functional layers described above may be omitted in the carrier adjustment layers CA1 and CA2.

Figure 3:
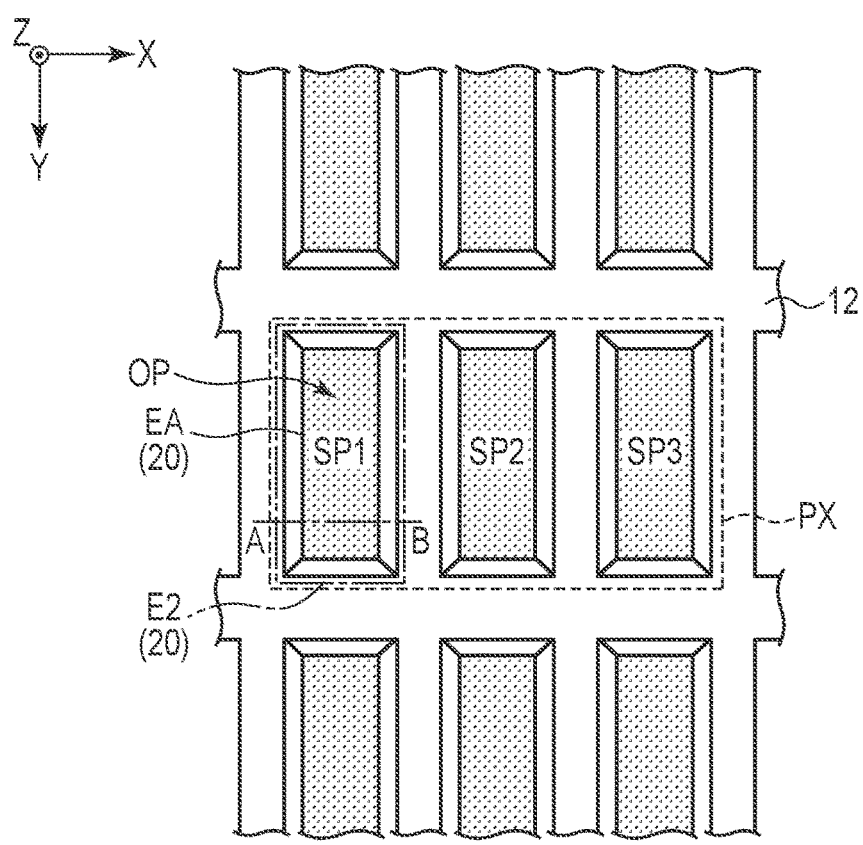
FIG. 3 is a plan view showing an example of a pixel PX shown in FIG. 1.

FIG. 3 is a plan view showing an example of the pixel PX shown in FIG. 1.

The subpixels SP1, SP2 and SP3 that constitute one pixel PX are each formed into a rectangular shape elongated along the second direction Y, and are aligned in the first direction X. The outer shape of the subpixels corresponds to the outer shape of the light-emitting area EA in the display element 20, but it is shown in a simplified way and therefore it does not necessarily reflect the actual shape. Here, it is assumed that the light-emitting area EA is formed into a rectangular shape with short sides extending along the first direction X and long sides extending along the second direction Y.

The insulating layer 12, which will be described in detail later, is formed into a grid pattern extending along the first and second directions X and Y in planar view, which surrounds each of the subpixels SP1, SP2 and SP3, or the display element 20 of each subpixel. The insulating layer 12 with such a configuration may be referred to as ribs, partitions, banks, etc. The light-emitting area EA is formed in each opening OP of the insulating layer 12 and corresponds to the region where the organic layer OR is interposed between the lower electrode E1 and the upper electrode E2.

The upper electrode E2 of the display element 20 overlaps the light-emitting area EA, as indicated by the single-dot chain line. To the upper electrode E2, a predetermined potential is supplied from a power feed line, which will not be described in detail.

FIG. 4 is a cross-sectional view of the display element 20 taken along line A-B in FIG. 3.

The pixel circuit 1 shown in FIG. 1 is disposed on the base 10 and covered by an insulating layer 11. FIG. 4 illustrates a drive transistor 3 contained in the pixel circuit 1 in a simplified way. The insulating layer (first insulating layer) 11 corresponds to an underlying layer of the display element 20. The insulating layer (second insulating layer) 12 is disposed on the insulating layer 11. The insulating layers 11 and 12 are, for example, organic insulating layers.

The lower electrode E1 is disposed on the insulating layer 11. The lower electrode E1 is an electrode provided for each subpixel or each display element, and is electrically connected to the drive transistor 3. The lower electrode E1 with such a configuration may be referred to as a pixel electrode, anode or the like.

The lower electrode E1 is, for example, a metal electrode formed of a metal material such as silver or aluminum. Note that the lower electrode E1 may be, for example, a transparent electrode formed of a transparent conductive material such as indium tin oxide (ITO) or indium zinc oxide (IZO). Further, the lower electrode E1 may as well be a stacked body of a transparent electrode and a metal electrode. For example, the lower electrode E1 may be configured as a stacked body consisting of a transparent electrode, a metal electrode and a transparent electrode stacked one on another in this order, or may be configured as a stacked body consisting of three or more layers. The lower electrode E1 may be configured to be different from other regions in a partial region. In the display device 20 of a top emission type, the lower electrode E1 includes a metal electrode as a reflective electrode.

The insulating layer 12 includes an opening OP, sloping surfaces S1 and S2 and upper surfaces U1 and U2. The opening OP is a through-hole formed in the region overlapping the lower electrode E1 and penetrating the insulating layer 12 to the lower electrode E1. The peripheral portion of the lower electrode E1 is covered by the insulating layer 12, and the central portion of the lower electrode E1 is exposed from the insulating layer 12 in the opening OP.

The sloping surfaces S1 and S2 face the opening OP. The upper surface U1 is connected to the sloping surface S1. The upper surface U2 is connected to the sloping surface S2. The upper surfaces U1 and U2 and the sloping surfaces S1 and S2 are, for example, flat surfaces, but they may as well be curved surfaces. The angle between the sloping surface S1 and the upper surface U1, and the angle between the sloping surface S2 and the upper surface U2 are preferably both obtuse angles. The angle between the sloping surface S1 and the lower electrode E1, and the angle between the sloping surface S2 and the lower electrode E1 are preferably both obtuse angles.

The organic layer OR includes a plurality of functional layers in addition to the light-emitting layer EL, as explained with reference to FIG. 2. The organic layer OR is disposed in the opening OP and covers the lower electrode E1. In the example shown in FIG. 4, the organic layer OR is disposed on the sloping surfaces S1 and S2, and further on a part of the upper surface U1 and a part of the upper surface U2.

The upper electrode E2 is stacked on the organic layer OR. The upper electrode E2 includes a first end surface SS1 located directly above the insulating layer 12. In other words, the first end surface SS1 is located outside the opening OP. In the example shown in FIG. 3, the first end surface SS1 is located above the organic layer OR. In other words, the upper electrode E2 exposes the peripheral portion of the organic layer OR. Note that the upper electrode E2 may cover the entire organic layer OR including the peripheral portion of the organic layer OR. In this case, the first end surface SS1 is located directly on the upper surfaces U1 and U2 of the insulating layer 12.

The first end surface SS1 is an inclined surface. The angle between the first end surface SS1 and the organic layer OR, the angle between the first end surface SS1 and the upper surface U1, and the angle between the first end surface SS1 and the upper surface U2 are preferably obtuse angles. That is, the thickness of the upper electrode E2 along the third direction Z decreases as the location is further on an outer side (further from the opening OP). The region of the upper electrode E2, which overlaps the first end surface SS1 is referred to as a tapered portion TP. The upper electrode E2 with such a configuration may be referred to as a common electrode, counter electrode, cathode or the like.

The upper electrode E2 is a semi-transmissive metal electrode formed of, for example, a metal material such as magnesium or silver. The upper electrode E2 may be a transparent electrode formed of a transparent conductive material such as ITO or IZO. The upper electrode E2 may as well be a stacked body of a transparent electrode and a metal electrode. The upper electrode E2 may be configured to be different from other regions in a partial region. The upper electrode E2 is electrically connected to a power feed line disposed in the display area DA or a power feed line disposed on an outer side of the display area DA.

The portion of the organic layer OR, which is located between the lower electrode E1 and the upper electrode E2 without interposing the insulating layer 12 therebetween, can form a light-emitting region of the display element 20. For example, the thickness of the organic layer OR along the third direction Z is set such that the peak wavelength of the spectrum of the emitted light in the light-emitting layer EL matches the effective length of the optical path between the lower electrode E1 and the upper electrode E2. Thus, a microcavity structure to achieve the resonance effect can be realized.

The optical adjustment layer 40 is in contact with the upper electrode E2. The optical adjustment layer 40 includes a second end surface SS2 located on an inner side with respect to the first end surface SS1 (or the tapered portion TP). In other words, the optical adjustment layer 40 exposes the peripheral portion of the upper electrode E2 including the tapered portion TP. The second end surface SS2 is located on an outer side with respect to the opening OP. That is, the optical adjustment layer 40 is disposed to be in contact with the entire surface of the upper electrode E2 at least in the opening OP. Thus, the second end surface SS2 is located on an outer side of the opening OP and an inner side of the tapered portion TP (or the first end surface SS1).

The second end surface SS2 is, for example, an inclined surface. That is, the thickness of the optical adjustment layer 40 along the third direction Z decreases as the location is further on an outer side (further from the opening OP). For example, the inclination of the second end surface SS2 is greater than that of the first end surface SS1. In other words, the first end surface SS1 is a gentle slope with a relatively small inclination (a relatively small angle with respect to the bottom surface), while the second end surface SS2 is a steep slope with a relatively large inclination.

The optical adjustment layer 40 with such a configuration is provided for the purpose of improving the extraction efficiency of the light from the display element 20. The thickness and refractive index of the optical adjustment layer 40 are selected according to the intensity and wavelength of the light emitted from the emission layer EL. For example, the optical adjustment layer 40 is a multilayer film. The thin film which constitutes the optical adjustment layer 40 may be formed from a conductive material, inorganic material or organic material.

The display element 20 and the optical adjustment layer 40 are covered by a sealing layer 50. In the example shown in FIG. 4, the sealing layer 50 is in contact with the first end surface SS1 and also with the insulating layer 12 on an outer side of the organic layer OR. The sealing layer 50 is provided to prevent moisture and the like from entering the organic layer OR from outside as one of its functions. For example, the sealing layer 50 is formed of an inorganic material such as silicon nitride or silicon oxide. The sealing layer 50 may also include a thin film formed of an organic material.

As explained above, the optical adjustment layer 40 is in contact with the upper electrode E2 that constitutes the display element 20, thereby making it possible to improve the extraction efficiency of the light generated by the display element 20. Further, the optical adjustment layer 40 is provided in the light-emitting area EA of the display element 20, that is, the region overlapping the opening OP of the insulating layer 12. Therefore, of the light generated by the display element 20, the light having a predetermined wavelength, on which the resonance effect has been exerted, is extracted, and the luminance and color purity of the displayed light can be improved.

Incidentally, when light is emitted by recombination of carriers leaking from the organic layer OR on the insulating layer 12, the light is not subjected to the resonance effect of the microcavity structure, and therefore it has a wavelength different from the predetermined wavelength. Therefore, if light of an undesired wavelength is extracted separately from the light of the predetermined wavelength during low-gradation display, the ratio of the light of the undesired wavelength occupying in the displayed light increases, and the desired chromaticity may not be obtained (that is, causing degradation in the color purity).

In order to avoid this, the optical adjustment layer 40 is provided in such a way that it does not overlap the first end surface SS1 of the upper electrode E2. With this configuration, even if undesired light emission occurs in the vicinity of the first end surface SS1, the light is not transmitted through the optical adjustment layer 40 and does not substantially contribute to the display. Therefore, even in the case of low gradation display, the ratio of light having an undesired wavelength occupying in the display light is reduced, and the desired chromaticity can be obtained.

FIG. 5 is a cross-sectional view of a comparative example of the display element 20.

The example shown in FIG. 5 is different from that of FIG. 4 in that the optical adjustment layer 40 covers the first end surface SS1 of the upper electrode E2. In other words, the second end surface SS2 of the optical adjustment layer 40 is located on an outer side with respect to the first end surface SS1.

In the comparative example with such a configuration, if an undesired light emission occurs in the vicinity of the first end surface SS1, the light is extracted by the optical adjustment layer 40 and contributes to the display. Therefore, as compared to the example shown in FIG. 4, the ratio of light with an undesired wavelength occupying in the display light increases during low-gradation display. Accordingly, the color purity obtained in the comparative example is lower than the color purity obtained in the example shown in FIG. 4.

According to the embodiments provided above, it is possible to provide a display device which can obtain a desired chromaticity.

Based on the display device which has been described in the above-described embodiments, a person having ordinary skill in the art may achieve a display device with an arbitral design change; however, as long as they fall within the scope and spirit of the present invention, such a display device is encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
an insulating substrate;
a first insulating layer disposed above the insulating substrate;
a lower electrode disposed on the first insulating layer;
a second insulating layer disposed on the first insulating layer and comprising a first opening overlapping the lower electrode, a second opening, and a third opening;
an organic layer including a light-emitting layer, disposed in the first opening, extending on the second insulating layer and covering the lower electrode;
an upper electrode disposed on the organic layer and comprising a first end surface which is an inclined surface; and an optical adjustment layer comprising a second end surface on an inner side with respect to the first end surface and in contact with the upper electrode, wherein
the first opening and the second opening are arranged in a first direction,
the first opening and the third opening are arranged in a second direction crossing the first direction,
the organic layer is not disposed in the second opening and the third opening,
the first end surface is located on the organic layer,
the upper electrode exposes a peripheral portion of an upper surface of the organic layer,
the second end surface is located on the upper electrode, and
the optical adjustment layer exposes a peripheral portion of an upper surface of the upper electrode.

2. The display device of claim 1, wherein the second end surface is located on an outer side with respect to the first opening.

3. The display device of claim 2, further comprising:
a sealing layer in contact with the first end surface and covering the optical adjustment layer.

4. The display device of claim 3, wherein
the sealing layer is in contact with the second insulating layer on an outer side with respect to the organic layer.

5. The display device of claim 1, further comprising:
a sealing layer in contact with the peripheral portion of the organic layer and the first end surface and covering the optical adjustment layer.

6. The display device of claim 1, further comprising:
a sealing layer in contact with the peripheral portion of the upper electrode and the second end surface and covering the optical adjustment layer.

7. The display device of claim 1, wherein
an inclination of the second end surface is greater than an inclination of the first end surface.

8. The display device of claim 1, wherein
the optical adjustment layer is a multilayer film comprising a plurality of thin films stacked one on another.

9. The display device of claim 1, wherein
the organic layer comprising a third end surface on the second insulating layer, and
the first end surface is between the second end surface and the third end surface above the second insulating layer.

10. The display device of claim 9, further comprising a sealing layer covering the optical adjustment layer, wherein
the sealing layer is in contact with the third end surface and the upper surface of the organic layer between the first end surface and the third end surface, and is in contact with the first end surface and the upper surface of the upper electrode between the first end surface and the second end surface.

* * * * *